US010673433B2

(12) United States Patent
Kobayashi et al.

(10) Patent No.: US 10,673,433 B2
(45) Date of Patent: Jun. 2, 2020

(54) CONTROL SWITCH MECHANISM, TRIGGER SWITCH, AND ELECTRIC TOOL (71) Applicant: OMRON CORPORATION, Kyoto-shi, Kyoto (JP)

(72) Inventors: Minoru Kobayashi, Okayama (JP); Yusaku Yamasaki, Kurashiki (JP); Koji Omori, Takatsuki (JP); Jeongho Baik, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/755,592

(22) PCT Filed: Nov. 21, 2016

(86) PCT No.: PCT/JP2016/084467
§ 371 (c)(1),
(2) Date: Feb. 27, 2018

(87) PCT Pub. No.: WO2017/138213
PCT Pub. Date: Aug. 17, 2017

(65) Prior Publication Data
US 2019/0028100 A1  Jan. 24, 2019

(30) Foreign Application Priority Data
Feb. 12, 2016  (JP) .................................. 2016-025351

(51) Int. Cl.
*H03K 17/96* (2006.01)
*H03K 17/968* (2006.01)
(Continued)

(52) U.S. Cl.
CPC ............. *H03K 17/968* (2013.01); *B25F 5/00* (2013.01); *B25F 5/006* (2013.01); *H01H 13/00* (2013.01);
(Continued)

(58) Field of Classification Search
CPC ...... H03K 17/968; H03K 17/78; H01H 13/00; H01H 35/00; B25F 5/006; B25F 5/00
See application file for complete search history.

(56) References Cited

U.S. PATENT DOCUMENTS

| 5,008,534 A | 4/1991 | Yonezawa et al. |
| 2003/0094356 A1 | 5/2003 | Waldron |
| 2011/0270214 A1* | 11/2011 | Jorgensen ......... A61M 5/31551 604/500 |

FOREIGN PATENT DOCUMENTS

| CN | 1420508 A | 5/2003 |
| CN | 101247120 A | 8/2008 |

(Continued)

OTHER PUBLICATIONS

The Chinese Office Action dated Oct. 31, 2018 in a counterpart Chinese patent application.

(Continued)

*Primary Examiner* — Tony Ko
(74) *Attorney, Agent, or Firm* — Metrolex IP Law Group, PLLC (57) ABSTRACT Provided are a control switch mechanism, a trigger switch, and an electric tool, having vibration resistance and durability and capable of preventing malfunction. The control switch mechanism (20) includes an optical sensor (21) having a light emitting element (21*a*) and a light receiving element (21*b*), and a reflector (22) that increases or decreases an amount of light received by the light receiving element (21*b*). An increase and a decrease in output of an operation device are controlled along with an increase and decrease in amount of light received by the light receiving element (21*b*) due to relative movement between the optical sensor (21) and the reflector (22).

5 Claims, 6 Drawing Sheets

(51) Int. Cl.
  *H01H 13/00*    (2006.01)
  *B25F 5/00*     (2006.01)
  *H01H 35/00*    (2006.01)
  *H03K 17/78*    (2006.01)

(52) U.S. Cl.
  CPC ............ *H01H 35/00* (2013.01); *H03K 17/78* (2013.01); *H01H 2239/022* (2013.01)

(56) References Cited

FOREIGN PATENT DOCUMENTS

| | | |
|---|---|---|
| CN | 104779109 A | 7/2015 |
| DE | 29817668 U1 | 1/1999 |
| DE | 102014004504 A1 | 10/2015 |
| EP | 2947774 A1 | 11/2015 |
| JP | S48-052871 U | 7/1973 |
| JP | S61-144552 U | 9/1986 |
| JP | S63-178036 U | 11/1988 |
| JP | H2-165524 A | 6/1990 |
| JP | H13-24228 U | 3/1991 |
| JP | H4-10938 U | 1/1992 |
| JP | H7-176237 A | 7/1995 |
| JP | 2007-982 A | 1/2007 |
| JP | 2012-245605 A | 12/2012 |

OTHER PUBLICATIONS

The Korean Office Action dated Feb. 21, 2019 in a counterpart Korean patent application.
An English translation of the International Search Report of PCT/JP2016/084467 dated Feb. 14, 2017.
An English translation of the Written Opinion of PCT/JP2016/084467 dated Feb. 14, 2017.
The extended European search report (EESR) dated Sep. 17, 2019 in a counterpart European patent application.

* cited by examiner

Length of reflection portion

102: Variable resistor
103: Sliding contact
101: Control circuit board

Fig. 8

CONTROL SWITCH MECHANISM, TRIGGER SWITCH, AND ELECTRIC TOOL

TECHNICAL FIELD

The present invention relates to a control switch mechanism, a trigger switch, and an electric tool which control an increase and a decrease in output of an operation device.

BACKGROUND ART

A trigger switch is a switch designed for an electric tool such as an electric saw blade, and is called a trigger switch because the shape of its operation unit resembles a trigger. A speed-controllable trigger switch capable of continuously controlling a motor rotational speed has also been developed as the trigger switch. This can, for example, increase and decrease the rotational speed of the electric saw blade.

Figure 7:
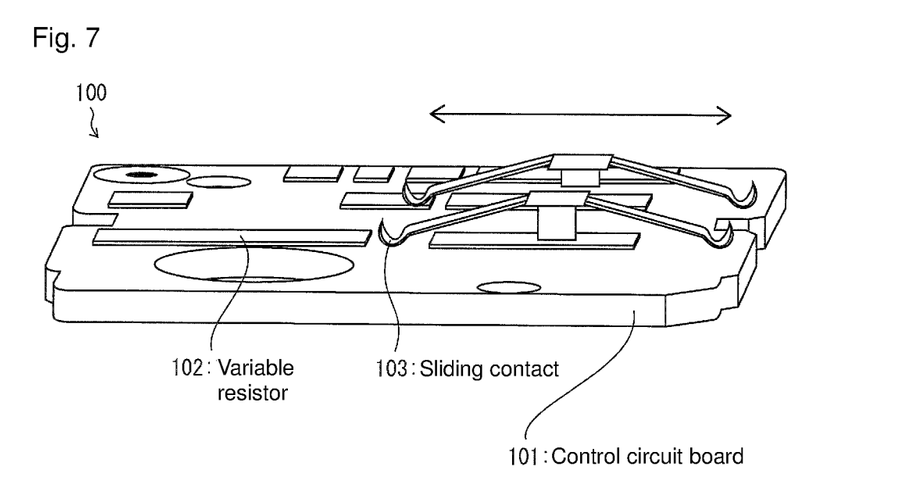
FIG. 7 is a perspective view illustrating a configuration of a conventional trigger switch including a sliding contact.

For example, as illustrated in FIG. 7, there is known a trigger switch as a speed-controllable trigger switch 100 as described above in which a sliding contact 103 is slid to a variable resistor 102 provided on a control circuit board 101 to control the motor speed by resistance change.

However, in the speed-controllable trigger switch 100 having adopted the sliding contact 103, conduction defects due to mechanical abrasion, mechanical wear, and vibration occur in the sliding contact 103 and the variable resistor 102, to shorten mechanical lives of the sliding contact 103 and the variable resistor 102 and make the output unstable.

In order to solve this problem, an electric tool trigger switch disclosed in Patent Document 1 has been proposed.

Figure 8:
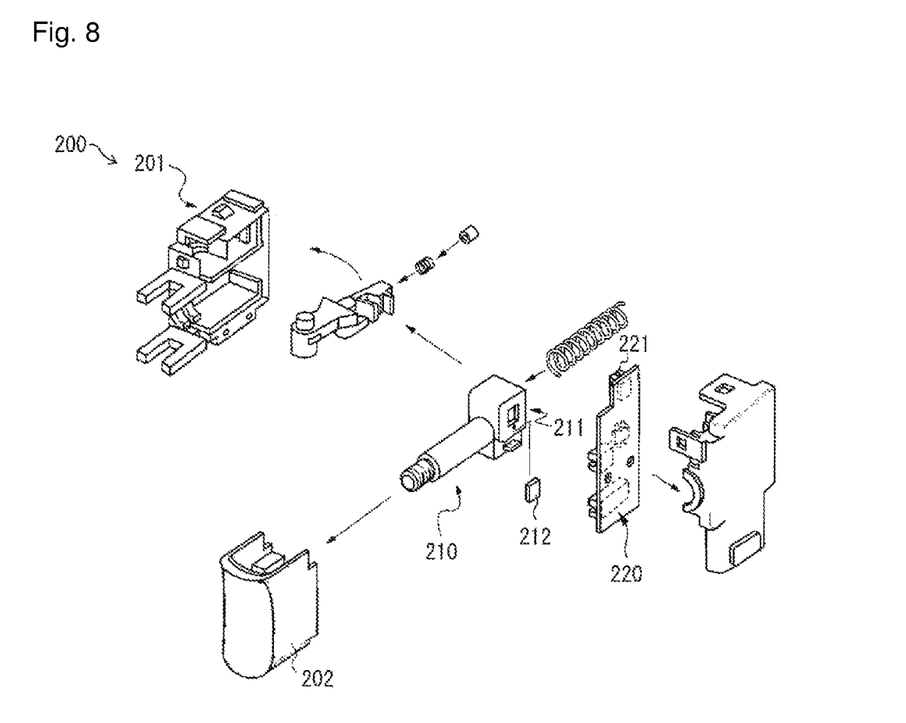
FIG. 8 is an exploded perspective view illustrating a configuration of another conventional trigger switch including a magnetic force sensor.

As illustrated in FIG. 8, an electric tool trigger switch 200 disclosed in Patent Document 1 includes a sliding operation unit 210 incorporated in a case 201 and moving in conjunction with the retracting operation of the trigger lever 202. The sliding operation unit 210 includes a permanent magnet 212 attached to the side surface of a speed controller 211 and a circuit board 220 provided with a magnetic field sensor 221 at a position facing the permanent magnet 212.

In the electric tool trigger switch 200, the speed controller 211 moves in a retracting direction in conjunction with a retracting operation of a trigger lever 202. At this time, a signal is generated by a change in magnetic field received by the magnetic field sensor 221, and a motor speed is controlled based on the generated signal.

PRIOR ART DOCUMENT

Patent Document

Patent Document 1: Japanese Unexamined Patent Publication No. 2012-245605 (Published on Dec. 13, 2012)

SUMMARY OF THE INVENTION

Problem to be Solved by the Invention

However, the electric tool trigger switch 200 disclosed in conventional Patent Document 1 described above has the following problem.

In the speed-controllable trigger switch using the conventional magnet and magnetic field sensor, it is unnecessary to use the sliding contact in the motor speed controller, but is absolutely necessary to use a magnet for generating magnetic force. In the use of the magnet in an external environment such as a high temperature/high vibration region, the magnetic force or the like might deteriorate over time, resulting in malfunction.

The present invention has been made in view of the above conventional problem, and it is an object of the present invention to provide a control switch mechanism, a trigger switch, and an electric tool, having vibration resistance and durability and capable of preventing malfunction.

Means for Solving the Problem

In order to solve the above problem, a control switch mechanism according to one aspect of the present invention includes: an optical sensor that has a light emitting element and a light receiving element; and a mechanical structure that increases or decreases an amount of light received by the light receiving element. An increase and a decrease in output of an operation device are controlled along with an increase and decrease in amount of light received by the light receiving element due to relative movement between the optical sensor and the mechanical structure.

A trigger switch according to one aspect of the present invention is a trigger switch including the control switch mechanism. The trigger switch includes an output controller that increases or decreases an output of the operation device along with a change in increase or decrease of the amount of light received by the light receiving element, as well as a change in increase or decrease of the amount of light received in conjunction with a retracting operation of the trigger lever.

In order to solve the above problem, an electric tool according to one aspect of the present invention includes the trigger switch.

Effect of the Invention

According to one aspect of the present invention, it is possible to provide a control switch mechanism, a trigger switch, and an electric tool, having vibration resistance and durability and capable of preventing malfunction.

BRIEF DESCRIPTION OF THE DRAWINGS

FIG. 2(*a*) and FIG. 2(*b*) are a perspective view and a side view, respectively, illustrating one example of inclination of a reflector in the trigger switch.

FIGS. 3(*a*) and 3(*b*) are a perspective view and a side view, respectively, illustrating another example of inclination of the reflector in the trigger switch.

FIGS. 6(*a*) and 6(*b*) are perspective views illustrating the configuration of the trigger switch before and after retraction of the trigger lever, respectively.

MODES FOR CARRYING OUT THE INVENTION

First Embodiment

An embodiment of the present invention will be described with reference to FIGS. 1 to 4.

In the first embodiment, a description will be given of a case where a control switch mechanism according to one aspect of the present invention is applied to a trigger switch of an electric tool. Note that the application is possible to an electric saw, an electric drill or the like, as the electric tool.

Figure 1:
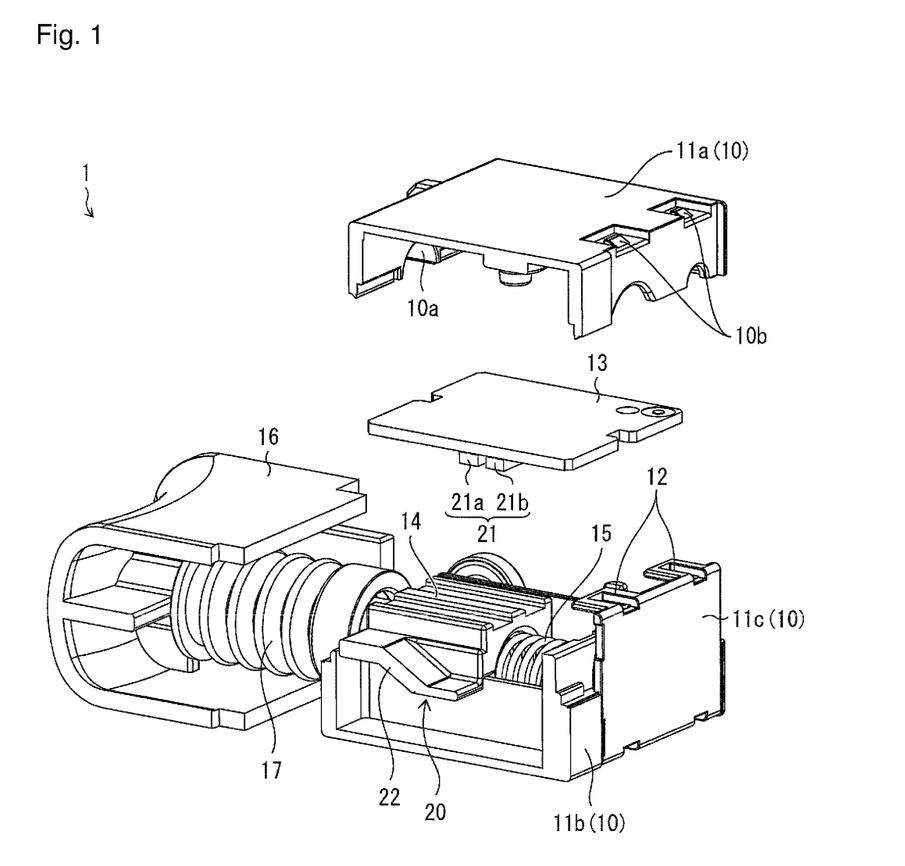
FIG. 1 is an exploded perspective view illustrating a configuration of a trigger switch including a control switch mechanism according to a first embodiment of the present invention.
Figure 2:
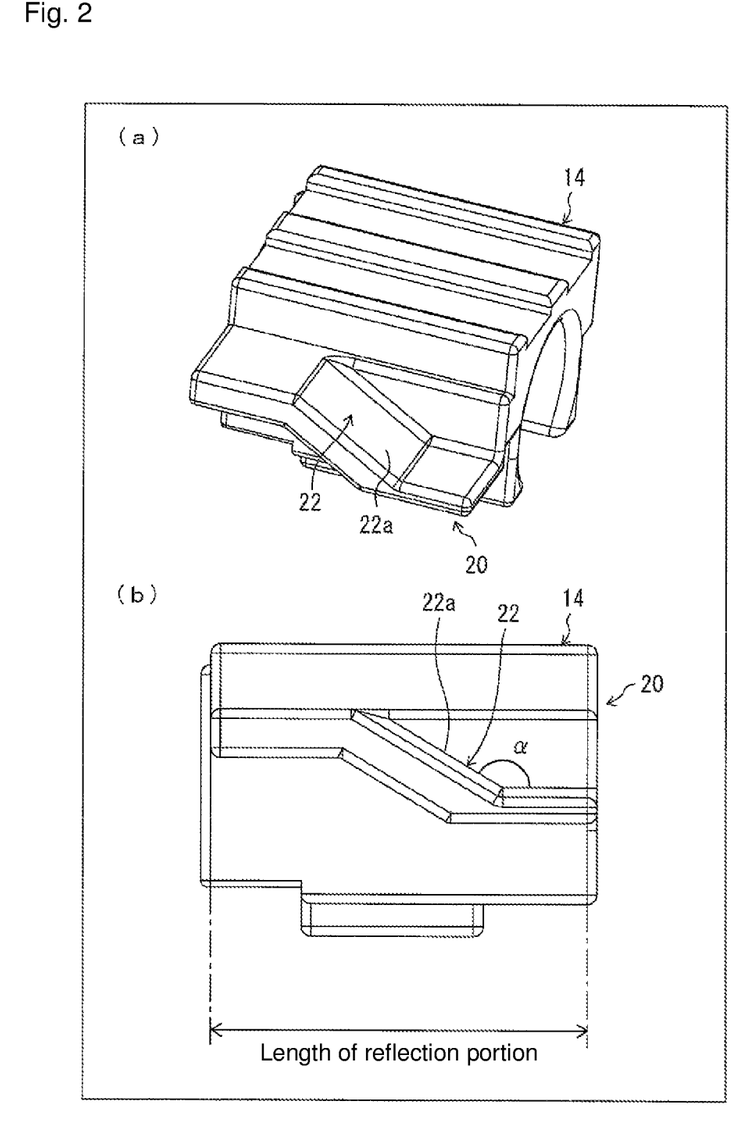
Figure 3:
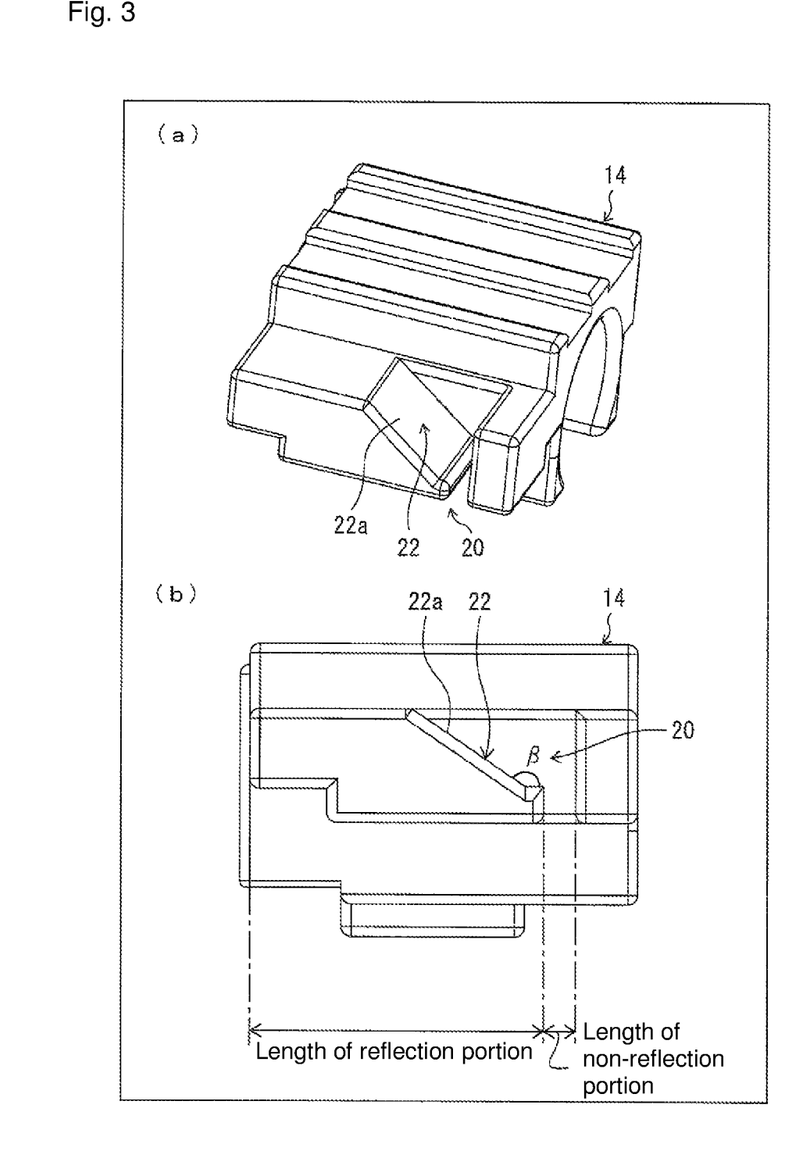

A configuration of a trigger switch 1 including the control switch mechanism in the first embodiment will be described with reference to FIG. 1 to FIGS. 3(a) and 3(b). FIG. 1 is a perspective view illustrating a configuration of the trigger switch 1 including a control switch mechanism 20 according to the first embodiment. In FIG. 1, in order to facilitate understanding of the internal structure, a part of the housing 10 is illustrated as broken. FIGS. 2(a) and 2(b) are a perspective view and a side view, respectively, illustrating one example of inclination of a reflector 22 in the trigger switch 1. FIGS. 3(a) and 3(b) are a perspective view and a side view, respectively, illustrating another example of inclination of the reflector 22 in the trigger switch 1.

As illustrated in FIG. 1, the trigger switch 1 of the first embodiment includes a printed board 13, a plunger 14, a return spring 15, and a control switch mechanism 20 in a housing 10 formed by combining a first cover 11a, a second cover 11b, and a third cover 11c. A trigger lever 16 and a bellows-like cylindrical body 17 are provided outside the housing 10.

A circular opening 10a is formed on the trigger lever 16 side of the first cover 11a and the second cover 11b, and the bellows-like cylindrical body 17 can be inserted into the circular opening 10a.

Hook portions 10b, 10b are provided at the end of the first cover 11a, and hook engaging portions 12, 12 provided on the third cover 11c are engaged with the hook portions 10b, 10b of the first cover 11a so that the housing 10 is integrally combined and fixed. Accordingly, the inside of the housing 10 is sealed and is in the state of not transmitting light.

Inside the housing 10, the printed board 13, the plunger 14, the return spring 15, and the control switch mechanism 20 are provided.

The printed board 13 is fixed to the third cover 11c and the first cover 11a, and has a function as an output controller according to one aspect of the present invention. Further, on the lower side of the printed board 13, an optical sensor 21 made up of a light emitting element 21a and a light receiving element 21b is provided. With this optical sensor 21 built in the sealed housing 10, stray light does not enter.

The plunger 14 is a movable body which is moved to the third cover 11c side with the tip of the bellows-like cylindrical body 17 abutting against the plunger 14 via the bellows-like cylindrical body 17 along with a retracting operation on the trigger lever 16. The return spring 15 made of a coil spring, for example, is provided between the plunger 14 and the third cover 11c. When the plunger 14 moves to the third cover 11c side, against this movement force, the return spring 15 urges restoration force for returning the plunger 14 to its original position.

As illustrated in FIGS. 2(a) and 2(b), the reflector 22 having an inclined surface 22a is formed on the side surface of the plunger 14 in the moving direction, and this reflector 22 moves forward and backward as the plunger 14 moves forward and backward.

The reflector 22 reflects light emitted from the light emitting element 21a and causes the light receiving element 21b to receive the reflected light, and has a function as the mechanical structure according to one aspect of the present invention.

In the trigger switch 1 of the first embodiment, the control switch mechanism 20 is made up of the optical sensor 21 including the light emitting element 21a and the light receiving element 21b, and the reflector 22. This control switch mechanism 20 is designed to control an increase and a decrease in output of a motor, not illustrated, being an operation device of an electric tool such as an electric saw, along with an increase and decrease in amount of light received by the light receiving element 21b due to relative movement of the optical sensor 21 and the reflector 22.

That is, in the first embodiment, the plunger 14 is moved forward to the third cover 11c side via the bellows-like cylindrical body 17 by performing the retracting operation on the trigger lever 16. Hence a distance from the light emitting element 21a to the inclined surface 22a of the reflector 22 changes. This means that the amount of light received by the light receiving element 21b is smaller when the distance from the light emitting element 21a to the inclined surface 22a of the reflector 22 is larger, whereas the amount of light received by the light receiving element 21b is larger when the distance from the light emitting element 21a to the inclined surface 22a of the reflector 22 is smaller. In the first embodiment, for example, the inclined surface 22a is inclined such that the distance from the light emitting element 21a is larger on the third cover 11c side and the distance from the light emitting element 21a is smaller on the side opposite to the third cover 11c side.

As a result, by performing the retracting operation on the trigger lever 16, the plunger 14 is moved forward to the third cover 11c side via the bellows-like cylindrical body 17. Thus, the distance from the light emitting element 21a to the inclined surface 22a becomes small. Therefore, the more the trigger lever 16 is retracted, the larger amount of light received by the light receiving element 21b becomes.

Further, in the trigger switch 1 of the first embodiment, an output controller, not illustrated, provided on the printed board 13 controls an increase or decrease in output of a motor, not illustrated, being the operation device of the electric tool such as the electric saw, along with a change in increase or decrease in amount of light received by the light receiving element 21b. As a result, the more the trigger lever 16 is retracted, the larger the output of the motor becomes and the higher the rotational speed of the electric saw blade, for example, becomes.

However, in one aspect of the present invention, this is not necessarily restrictive, and the inclination direction of the inclined surface 22a can be reversed. As a result, performing the retracting operation on the trigger lever 16 enables reduction in amount of light received by the light receiving element 21b and reduction in output of the motor.

In the first embodiment, the inclination angle of the inclined surface 22a of the reflector 22 is adjusted corresponding to the moving amount of the optical sensor 21.

Specifically, as illustrated in FIGS. 3(a) and 3(b), the inclination angle of the inclined surface 22a of the reflector 22 is made large, thereby enabling an immediate increase or decrease in output of the motor even when a relative moving amount of the optical sensor 21 and the reflector 22 is small. On the other hand, as illustrated in FIGS. 2(a) and 2(b), the inclination angle of the inclined surface 22a of the reflector 22 is made small, thereby enabling a gentle increase or decrease in output of the motor even when a relative moving amount of the optical sensor 21 and the reflector 22 is large.

In the first embodiment, the adjustment made on the inclination angle of the inclined surface 22a of the reflector 22 is described as illustrated in FIGS. 2(a) and 2(b) and FIGS. 3(a) and 3(b). However, not necessarily the inclination angle but also a distance in the depth direction, namely the distance from the optical sensor 21 to the reflector 22 can be adjusted. Accordingly, the amount of light received by the light receiving element 21b can greatly vary even with the short movement of the plunger 14.

Further, the inclined surface 22a of the reflector 22 is not necessarily flat, and in one aspect of the present invention, it may be curved, for example. Thus, when the sensitivity characteristic of the optical sensor 21 is nonlinear, it is possible to adjust, to a desired state, the output characteristic of the amount of light received by the light receiving element 21b in accordance with the moving amount of the reflector 22.

Meanwhile, in the trigger switch 1 of the first embodiment, the optical sensor 21 including the light emitting element 21a and the light receiving element 21b is fixed to the printed board 13, while the reflector 22 is fixed to the plunger 14, and the plunger 14 is moved forward so that the reflector 22 is moved forward along with the retracting operation on the trigger lever 16 However, in one aspect of the present invention, this is not necessarily restrictive, and it is also possible to fix the reflector 22 to the printed board 13, fix the optical sensor 21 to the plunger 14, and move the optical sensor 21 together with the plunger 14. Thus, moving the optical sensor 21 relative to the reflector 22 enables control of an increase in output of the motor.

Further, in the first embodiment, the output of the motor is increased in accordance with the magnitude of the amount of light received by the light receiving element 21b. However, in one aspect of the present invention, this is not necessarily restrictive, and it is also possible to reduce the output of the motor in accordance with the magnitude of the amount of light received by the light receiving element 21b.

Further, in the control switch mechanism 20 of the first embodiment, the reflectance of the reflector 22 varies by changing a material, surface treatment, or a color of the reflector 22. As the material for the reflector, for example, polycarbonate resin, polyprene resin, unsaturated polyester resin, polyethylene terephthalate resin, polyamide resin, or the like can be used. Further, performing the surface treatment enables adjustment of the reflectance such that the amount of light is set for the best sensitivity of the optical sensor 21, namely, the range of the amount of light is set in which the amount of light is appropriately changed along with forward movement of the reflector 22, and the output of the optical sensor 21 precisely changes. Furthermore, by using a white color as the color of the inclined surface 22a, the reflectance can be improved.

It is also possible to change the surface treatment and the color in accordance with the region of the reflector 22. It is thereby possible to change the amount of reflected light to a desired value by forward movement of the reflector 22.

A method for operating the trigger switch 1 having the above configuration will be described.

First, the retracting operation is performed on the trigger lever 16. Thereby, the plunger 14 moves forward to the third cover 11c via the bellows-like cylindrical body 17. At this time, the inclined surface 22a of the reflector 22 facing the optical sensor 21 fixed to the printed board 13 also moves forward so that the distance between the light emitting element 21a and the inclined surface 22a gradually decreases. As a result, the amount of light received by the light receiving element 21b increases, to increase the output of the motor.

When the pushing operation on the trigger lever 16 is stopped in the middle and the pushing position is held, the output of the motor corresponding to the position can be obtained. In a state where the trigger lever 16 is fully pushed in, the motor output becomes the largest. When the pressing force of the trigger lever 16 is weakened, the trigger lever 16 returns to the original position by the return spring 15.

As described above, the control switch mechanism 20 of the first embodiment includes the optical sensor 21 having the light emitting element 21a and the light receiving element 21b, and the mechanical structure which increase or decrease the amount of light received by the light receiving element 21b. An increase and a decrease in output of the operation device are controlled along with an increase and decrease in amount of light received by the light receiving element 21b due to relative movement between the optical sensor 21 and the mechanical structure.

As a result, in the first embodiment, the amount of light received by the light receiving element 21b is detected by the non-contact method using the optical sensor 21 that includes the light emitting element 21a and the light receiving element 21b. This is thus not a contact type switch, so that vibration resistance, durability and detection accuracy do not deteriorate due to abrasion of contacts. Therefore, in the control switch mechanism 20 of the first embodiment, the mechanical life of the sliding contact portion in the conventional control switch can be improved. In addition, there is no intermittent contact failure due to an influence of vibration exerted by the sliding contact portion, so that a stable output can be obtained.

Further, in the optical sensor 21 including the light emitting element 21a and the light receiving element 21b, deterioration over time does not occur in the use in an external environment such as a high temperature/high vibration region. In addition, the output voltage does not lower or fluctuate due to a decrease in magnetic force, so that malfunction, a change in characteristics, and an increase in variations can be prevented. This enables the quality of the control switch mechanism 20 to be maintained over a long period of time.

Therefore, it is possible to provide the control switch mechanism 20 having vibration resistance and durability and capable of preventing malfunction.

When a magnetic field sensor is used as the control switch mechanism, a built-in permanent magnet having a large thickness is preferable since the magnetic force is large and a change over time can be prevented. As a result, a wide space is required for detection. On the other hand, in the case of using the optical sensor 21, the light emitting element 21a, the light receiving element 21b, and the region where light passes may only be those required, and the distances between the reflector 22 and the light emitting element 21a/light receiving element 21b may only be required to be small. As a result, space saving can be realized as compared with the magnetic field sensor method. Considering that the distance between the magnetic field sensor and the permanent magnet is not simple, the use of the optical sensor 21 makes the structure simpler, the detection accuracy higher, and the handling easier.

In the control switch mechanism 20 according to the first embodiment, the optical sensor 21 and the mechanical structure move relative to each other, so that the amount of light received by the light receiving element 21b monotonically increases or decreases.

Accordingly, by relative movement between the optical sensor 21 and the reflector 22 having the inclined surface 22a, the distance from the light emitting element 21a to the reflector 22 monotonously changes, and the amount of light received by the light receiving element 21b monotonically increases or decreases.

As a result, it is possible to control the output of the operation device to increase or decrease, such as increasing or decreasing the output of the motor, based on a monotonous change in increase or decrease of the amount of light received by the light receiving element 21b.

Further, in the control switch mechanism 20 according to the first embodiment, the optical sensor 21 is made of the reflection type optical sensor, and the mechanical structure is made of the reflector 22 provided at a position facing the light emitting element 21a.

The control switch mechanism 20 can thereby be made up of the reflection type optical sensor 21.

In the control switch mechanism 20 of the first embodiment, the reflector 22 can be inclined at a predetermined angle with respect to a plane vertical to the optical axis of the light emitted from the light emitting element 21a.

With the inclination angle of the reflector 22 being the predetermined angle, the reflector 22 having a comparatively simple configuration can adjust an increase and a decrease in output of the operation device.

Further, in the control switch mechanism 20 of the first embodiment, the reflector 22 is inclined with respect to the plane vertical to the optical axis of the light emitted from the light emitting element 21a, and the inclination angle of the reflector 22 may vary in accordance with a region of the reflector 22 corresponding to a relative moving amount between the optical sensor 21 and the reflector 22. The meaning of that "the inclination angle of the reflector 22 varies in accordance with the region of the reflector 22" includes that the inclination angle of the reflector 22 changes in the entire region of the relative moving amount of the reflector 22, and includes that the inclination angle of the reflector 22 changes in a partial region of the relative moving amount of the reflector 22.

Thus, by changing the inclination angle of the reflector in the entire region or in the partial region, a rate of change in distance from the light emitting element to the reflector with respect to the relative moving amount can be changed at any time, to adjust an increase and a decrease in output of the operation device. For example, increasing the inclination angle of the reflector enables an immediate increase or decrease in output of the operation device even when the relative moving amount between the optical sensor and the mechanical structure is small. On the other hand, making the inclination angle of the reflector small enables a gentle increase or decrease in output of the operation device even when the relative moving amount between the optical sensor and the mechanical structure is large.

Further, in the control switch mechanism 20 of the first embodiment, the reflectance of the reflector 22 varies by changing a material, surface treatment or a color of the reflector 22. The meaning of that "the reflectance of the reflector 22 varies in accordance with the region of the reflector 22" includes that the material, the surface treatment or the color of the reflector 22 changes in the entire region of the relative moving amount of the reflector 22, and includes that the material, the surface treatment or the color of the reflector 22 changes in a partial region of the relative moving amount of the reflector 22.

Thus, by changing the material, the surface treatment or the color of the reflector 22, the reflectance of the reflector 22 can be changed, to enhance the detection capability of the optical sensor 21. In addition, it is possible to make the adjustment so as to obtain an appropriate amount of reflected light in accordance with the characteristics of the optical sensor 21. The material of the reflector 22 also includes the density and the hardness of the material.

Figure 4:
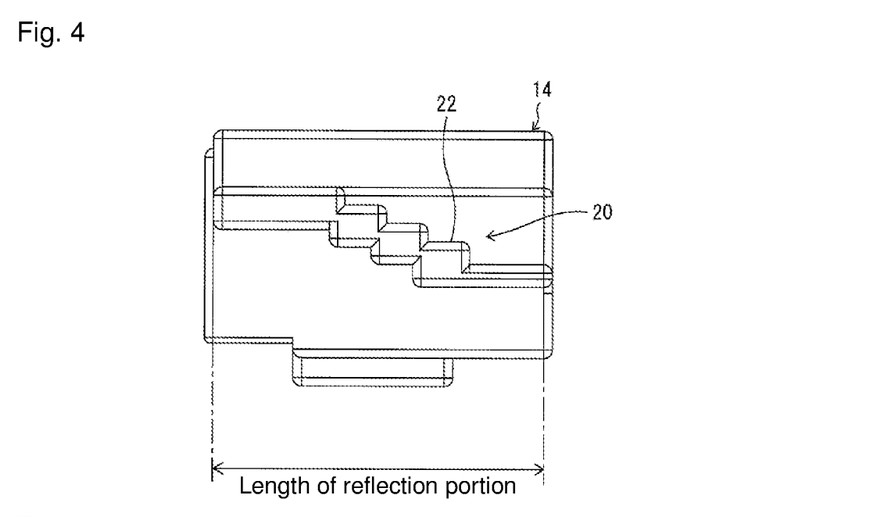
FIG. 4 is a side view illustrating a configuration of a modification of the reflector in the trigger switch.

Note that the present invention is not restricted to the above embodiment, and a variety of modifications are possible within the scope of the present invention. For example, in the control switch mechanism 20 of the above embodiment, the reflector 22 is formed of the inclined surface 22a. However, in one aspect of the present invention, this is not necessarily restrictive, and for example, as illustrated in FIG. 4, it is possible to form the reflector 22 into a staircase shape.

Accordingly, by relative movement between the optical sensor 21 and the stair-like reflector 22, the distance from the light emitting element 21a to the reflector 22 changes stepwise and the amount of light received by the light receiving element 21b increases or decreases stepwise.

As a result, it is possible to control the output of the operation device to increase or decrease, such as increasing or decreasing the output of the motor stepwise based on a stepwise change in increase or decrease in amount of light received by the light receiving element 21b.

Embodiment 2

Another embodiment of the present invention will be described with reference to FIGS. 5 and 6(a) and 6(b). Note that configurations other than those described in the second embodiment are the same as those in the first embodiment. Further, for convenience of description, members having the same functions as the members illustrated in the drawings of the first embodiment are denoted by the same reference numerals, and the description thereof is omitted.

In the trigger switch 1 of the first embodiment, the optical sensor 21 is made of a transmission type optical sensor, and the mechanical structure made of the reflector 22 provided at the position facing the light emitting element 21a is adopted. A trigger switch 2 of the second embodiment is different from the above in that an optical sensor 31 is made of a transmission type optical sensor and that a mechanical structure made of a shielding plate provided between a light emitting element 31a and a light receiving element 31b is provided.

The configuration of the trigger switch 2 provided with a control switch mechanism 30 in the second embodiment will be described with reference to FIGS. 5 and 6(a) and 6(b). FIG. 5 is a perspective view illustrating the configuration of the trigger switch 2 having the control switch mechanism 30 in the second embodiment. In FIG. 5, in order to facilitate understanding of the internal structure, a part of the housing 10 is illustrated as broken. FIGS. 6(a) and 6(b) are perspective views illustrating the configuration of the trigger switch 2 before and after retraction of the trigger lever 16, respectively.

Figure 5:
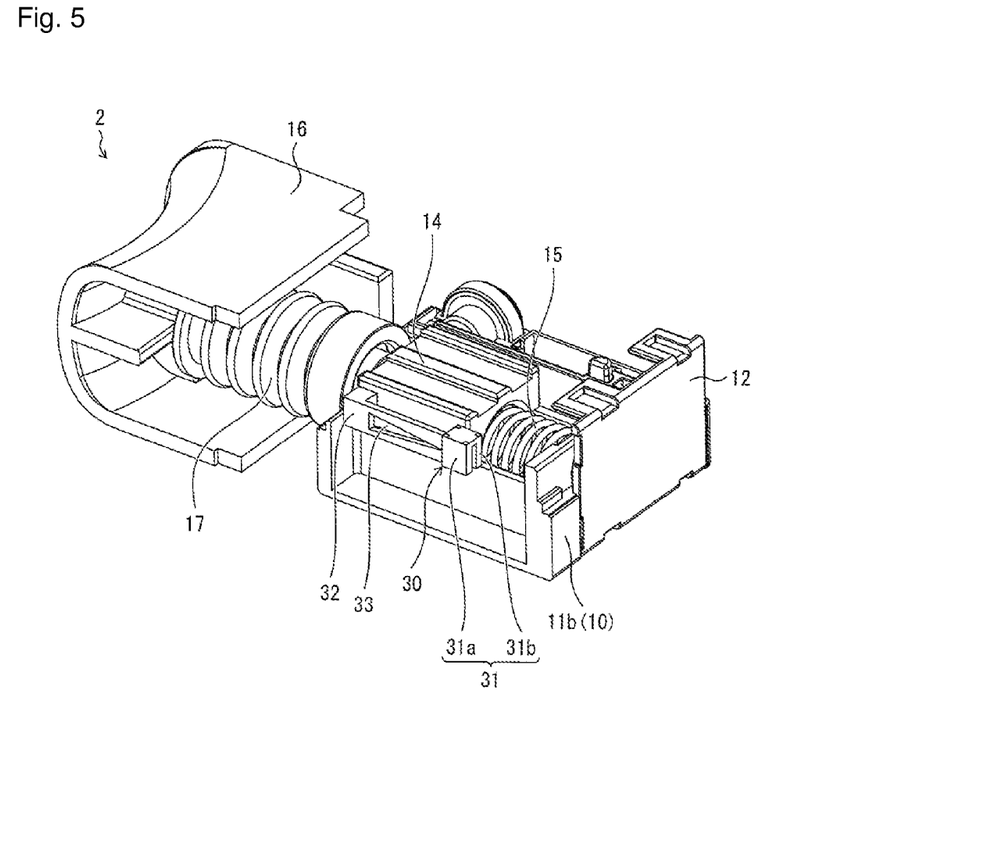
FIG. 5 is a perspective view illustrating a configuration of a trigger switch according to a second embodiment of the present invention.

As illustrated in FIG. 5, the trigger switch 2 of the second embodiment is provided with the control switch mechanism 30 in the housing 10 in a sealed state.

The control switch mechanism 30 of the second embodiment includes the shielding plate 32 as a mechanical structure having a slit 33, provided on the side surface of the plunger 14 in the moving direction, and the optical sensor 31 including the light emitting element 31a and the light receiving element 31b provided on both sides of the shielding plate 32. Therefore, in the control switch mechanism 30 of the second embodiment, the optical sensor 31 adopts a transmission type optical sensor.

The slit 33 has a triangular cross section in which the trigger lever 16 side has a large opening area as compared with that of the third cover 11c side. When the plunger 14 is moved forward to the third cover 11c side via the bellows-like cylindrical body 17 by the retracting operation on the trigger lever 16, the shielding plate 32 having the slit 33 also moves forward to the third cover 11c side.

On the other hand, an optical sensor 31 including the light emitting element 31a and the light receiving element 31b provided on both sides of the shielding plate 32 is fixed to a printed board 13 not illustrated.

Figure 6:
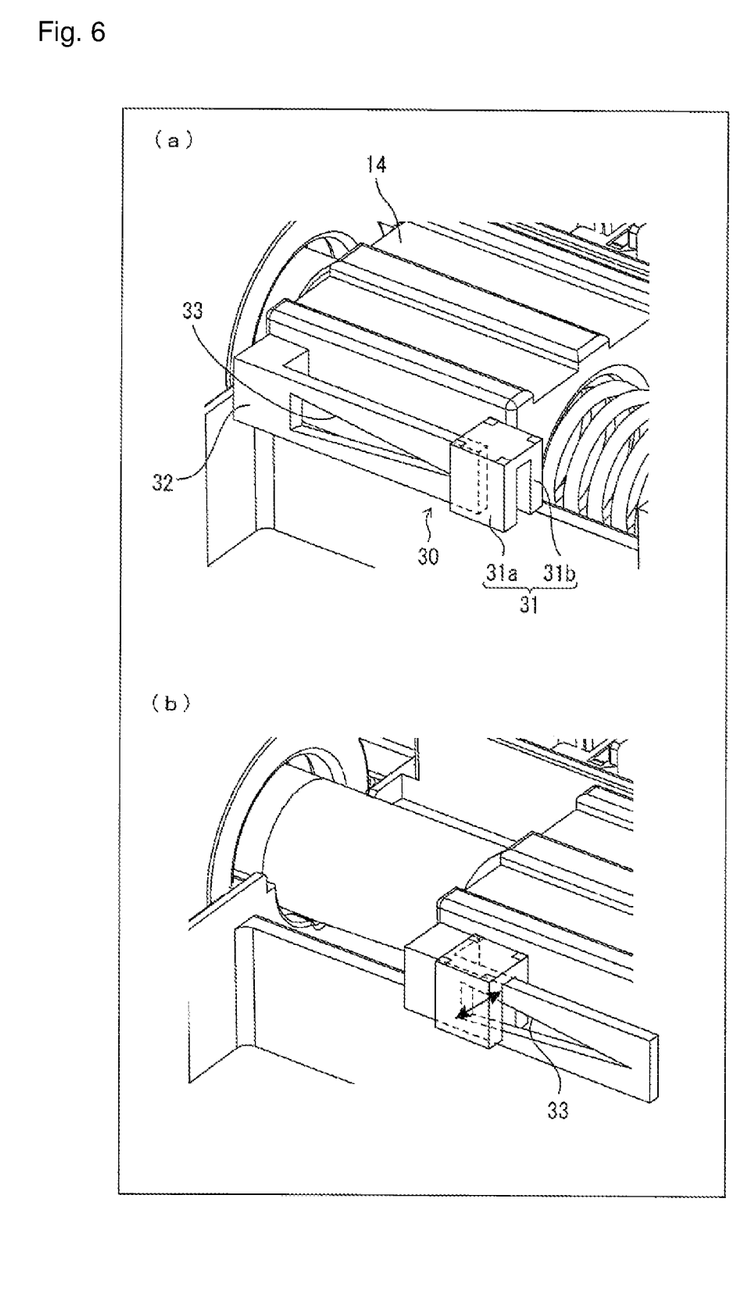

As a result, as illustrated in FIGS. 6(a) and 6(b), the opening area of the slit 33 increases along with forward movement of the shielding plate 32 to the third cover 11c side, so as to increase the amount of light transmitted from the light emitting element 31a to the light receiving element 31b through the slit 33. Therefore, along with forward movement of the shielding plate 32 to the third cover 11c side, the amount of light received by the light receiving element 21b increases. That is, the more the trigger lever 16 is retracted, the larger the amount of light received by the light receiving element 21b becomes.

In the trigger switch 2 of the embodiment, an output controller, not illustrated, provided on the printed board 13, not illustrated, controls an increase or decrease in output of a motor, not illustrated, being the operation device of the electric tool such as the electric saw, along with a change in increase or decrease in amount of light received by the light receiving element 21b. As a result, the more the trigger lever 16 is retracted, the larger the output of the motor becomes and the higher the rotational speed of the electric saw blade, for example, becomes.

However, in one aspect of the present invention, this is not necessarily restrictive, and the direction of the triangular opening of the slit 33 can be reversed with respect to the direction of moving forward and backward. As a result, performing the retracting operation on the trigger lever 16 enables reduction in amount of light received by the light receiving element 21b and reduction in output of the motor.

As described above, in the control switch mechanism 30 of the second embodiment, the slit 33 through which the light emitted from the light emitting element 31a passes is formed in the shielding plate 32 and the opening area of the slit 33 in the shielding plate 32 varies in accordance with the region of the shielding plate 32, corresponding to the relative moving amount between the optical sensor 31 and the shielding plate 32. The meaning of that "the opening area of the slit 33 in the shielding plate 32 varies in accordance with the region of the shielding plate 32" includes that the opening area of the slit in the shielding plate 32 changes in the entire region of the relative moving amount of the shielding plate 32, and includes that the opening area of the slit 33 in the shielding plate 32 changes in a partial region of the relative moving amount of the shielding plate 32.

As a result, the size of the opening area of the slit 33 in the shielding plate 32 changes with respect to the relative moving amount between the optical sensor 31 and the shielding plate 32, whereby it is possible to control an increase and a decrease in amount of light received by the light receiving element 21b and adjust an increase and a decrease in output of the motor.

In the trigger switch 2 of the embodiment, the optical sensor 31 including the light emitting element 31a and the light receiving element 31b is fixed to the printed board 13, while the shielding plate 32 is fixed to the plunger 14, and the plunger 14 is moved forward so that the shielding plate 32 is moved forward along with the retracting operation on the trigger lever 16. However, the present invention is not necessarily restricted thereto, and it is also possible to fix the shielding plate 32 to the printed board 13, fix the optical sensor 31 to the plunger 14, and move the optical sensor 31 forward and backward together with the plunger 14. Therefore, moving the optical sensor 31 relative to the shielding plate 32 enables control of an increase in output of the motor.

Further, in the second embodiment, the output of the motor is increased in accordance with the magnitude of the amount of light received by the light receiving element 31b. However, in one aspect of the present invention, this is not necessarily restrictive, and it is also possible to reduce the output of the motor in accordance with the magnitude of the amount of light received by the light receiving element 31b.

In the above description, the shielding plate 32 has the slit 33, but it does not mean that the slit 33 is necessarily required. For example, the shielding plate 32 without the slit 33 can also shield the space between the light emitting element 31a and the light receiving element 31b. This also enables control of an increase and a decrease in amount of light received by the light receiving element 21b. Specifically, when there is no slit 33 in the shielding plate 32, a transmittance of the shielding plate 32 is changed by changing the material, the surface treatment or the color of the shielding plate 32, so that an increase and a decrease in amount of light received by the light receiving element 31b can be controlled. In this case, the meaning of that "the transmittance of the shielding plate 32 is changed" includes that the material, the surface treatment, or the color of the shielding plate 32 is changed in the entire region of the relative moving amount of the shielding plate 32, and includes that the material, the surface treatment, or the color of the shielding plate 32 is changed in a partial region of the relative moving amount of the shielding plate 32.

As described above, in the control switch mechanism 30 of the second embodiment, the optical sensor 31 is made of a transmission type optical sensor. The mechanical structure is made up of the shielding plate 32 which is provided between the light emitting element 31a and the light receiving element 31b and which increases or decreases the amount of light received by the light receiving element 31b by relative movement between the optical sensor 31 and the mechanical structure.

Accordingly, the control switch mechanism 30 can be made up of the transmission type optical sensor 31 by using the transmission type optical sensor.

As described above, the trigger switches 1, 2 and the electric tool according to the embodiments are provided with the control switch mechanisms 20, 30.

It is thus possible to provide the trigger switches 1, 2 and the electric tool provided with the control switch mechanisms 20, 30 having vibration resistance and durability and capable of preventing malfunction.

As described above, in order to solve the above problem, a control switch mechanism according to one aspect of the present invention includes: an optical sensor that has a light emitting element and a light receiving element; and a mechanical structure that increases or decreases an amount of light received by the light receiving element. An increase and a decrease in output of an operation device are controlled along with an increase and decrease in amount of light received by the light receiving element due to relative movement between the optical sensor and the mechanical structure.

For example, a conventional control switch mechanism of a sliding contact type is present, but has a problem where the mechanical life of the sliding contact is short and the output is unstable. Further, a control switch mechanism of a magnet type is present, but has the problem of deterioration over time such as magnetic force deterioration. In any case, the durability performance is inferior.

In contrast, in one aspect of the present invention, the control switch mechanism includes an optical sensor having a light emitting element and a light receiving element, and a mechanical structure that increases or decreases the amount of light received by the light receiving element. Then, an increase and a decrease in output of the operation device is controlled along with an increase and decrease in amount of light received by the light receiving element due to relative movement between the optical sensor and the mechanical structure.

As a result, in one aspect of the present invention, the amount of light received by the light receiving element is detected by the non-contact method using an optical sensor that includes the light emitting element and the light receiving element. This is thus not a contact type switch, so that durability does not deteriorate due to abrasion of contacts.

Further, in the optical sensor including the light emitting element and the light receiving element, deterioration over time does not occur in the use in an external environment such as a high temperature/high vibration region, and malfunction does not occur.

Therefore, it is possible to provide a control switch mechanism having vibration resistance and durability and capable of preventing malfunction.

In the control switch mechanism according to one aspect of the present invention, in the control switch mechanism, the mechanical structure is formed so as to monotonically increase or decrease the amount of light received by the light receiving element by relative movement between the optical sensor and the mechanical structure.

As the mechanical structure, for example, a reflector having an inclined surface on the surface facing the light emitting element can be installed. Accordingly, by relative movement between the optical sensor and the reflector having the inclined surface, the distance from the light emitting element to the reflector monotonously changes, and the amount of light received by the light receiving element monotonically increases or decreases.

As a result, it is possible to control the output of the operation device to increase or decrease, such as increasing or decreasing the output of the motor, based on a monotonous change in increase or decrease of the amount of light received by the light receiving element.

In the control switch mechanism according to one aspect of the present invention, in the control switch mechanism, the mechanical structure is formed so as to increase or decrease stepwise the amount of light received by the light receiving element by relative movement between the optical sensor and the mechanical structure.

As the mechanical structure, for example, a reflector that changes its distance stepwise can be installed on the surface facing the light emitting element. Accordingly, by relative movement between the optical sensor and the reflector that changes its distance stepwise, the distance from the light emitting element to the reflector changes stepwise and the amount of light received by the light receiving element increases or decreases stepwise.

As a result, it is possible to control the output of the operation device to increase or decrease, such as increasing or decreasing the output of the motor stepwise, based on a stepwise change in increase or decrease of the amount of light received by the light receiving element.

In the control switch mechanism according to one aspect of the present invention, in the control switch mechanism, the optical sensor is made of a reflection type optical sensor, and the mechanical structure is made of a reflector provided at a position facing the light emitting element.

The control switch mechanism can thereby be made up of the reflection type optical sensor by using the reflection type optical sensor.

Further, in the control switch mechanism according to one aspect of the present invention, the reflector is inclined at a predetermined angle with respect to a plane vertical to an optical axis of light emitted from the light emitting element.

With the inclination angle of the reflector being the predetermined angle, the reflector having a comparatively simple configuration can adjust an increase and a decrease in output of the operation device.

In the control switch mechanism according to one aspect of the present invention, in the control switch mechanism, the reflector is inclined with respect to a plane vertical to an optical axis of light emitted from the light emitting element, and an inclination angle of the reflector varies in accordance with a region of the reflector in accordance with a relative moving amount between the optical sensor and the mechanical structure. The meaning of that "the inclination angle of the reflector varies in accordance with a region of the reflector" includes that the inclination angle of the reflector changes in the entire region of the relative moving amount of the reflector, and includes that the inclination angle of the reflector changes in a partial region of the relative moving amount of the reflector.

Thus, by changing the inclination angle of the reflector in the entire region or in the partial region, a rate of change in distance from the light emitting element to the reflector with respect to the relative moving amount can be changed at any time, to adjust an increase and a decrease in output of the operation device. For example, increasing the inclination angle of the reflector enables an immediate increase or decrease in output of the operation device even when the relative moving amount between the optical sensor and the mechanical structure is small. On the other hand, making the inclination angle of the reflector small enables a gentle increase or decrease in output of the operation device even when the relative moving amount between the optical sensor and the mechanical structure is large.

Further, in the control switch mechanism according to one aspect of the present invention, a reflectance of the reflector varies in accordance with a region of the reflector by changing a material, surface treatment, or a color of the reflector. The meaning of that "the reflectance of the reflector varies in accordance with the region of the reflector" includes that the material, the surface treatment, or the color of the reflector is changed in the entire region of the relative moving amount of the reflector, and includes that the material, the surface treatment, or the color of the reflector is changed in a partial region of the relative moving amount of the reflector.

Thus, by changing the material, the surface treatment or the color of the reflector, the reflectance of the reflector can be changed, to enhance the detection capability of the optical sensor. In addition, it is possible to make the adjustment so as to obtain an appropriate amount of reflected light in accordance with the characteristics of the optical sensor.

Further, in the control switch mechanism according to one aspect of the present invention, in the control switch mechanism, the optical sensor is a transmission type optical sensor, and the mechanical structure is made of a shielding plate which is provided between the light emitting element and the light receiving element, and increases or decreases the amount of light received by the light receiving element by relative movement between the optical sensor and the mechanical structure.

Accordingly, the control switch mechanism can be made up of the transmission type optical sensor by using the transmission type optical sensor.

There is an on/off type switch that includes a transmission type optical sensor and shields light emitted from the light emitting element with the shielding plate. However, there is no control switch mechanism for increasing or decreasing the amount of light received by the light receiving element by relative movement between the light emitting element and the shielding plate.

In the control switch mechanism according to one aspect of the present invention, in the control switch mechanism, a slit through which light emitted from the light emitting element passes is formed in the shielding plate, and an opening area of the slit in the shielding plate varies in accordance with the region of the shielding plate, corresponding to relative moving amount between the optical sensor and the mechanical structure. The meaning of that "the opening area of the slit in the shielding plate varies in accordance with the region of the shielding plate" includes that the opening area of the slit in the shielding plate changes in the entire region of the relative moving amount of the shielding plate, and includes that the opening area of the slit in the shielding plate changes in a partial region of the relative moving amount of the shielding plate.

As a result, the size of the opening area of the slit in the shielding plate changes with respect to the relative moving amount between the optical sensor and the mechanical structure, whereby it is possible to control an increase and a decrease in amount of light received by the light receiving element and adjust an increase and a decrease in output of the operation device.

In the control switch mechanism according to one aspect of the present invention, in the control switch mechanism, a transmittance of the shielding plate varies in accordance with the region of the shielding plate by changing a material, surface treatment or color of the shielding plate. The meaning of that "the transmittance of the shielding plate varies in accordance with the region of the shielding plate" includes that the material, the surface treatment, or the color of the shielding plate is changed in the entire region of the relative moving amount of the shielding plate, and includes that the material, the surface treatment, or the color of the shielding plate is changed in a partial region of the relative moving amount of the shielding plate.

Thus, when there is no opening in the shielding plate, by changing the material, surface treatment or color of the shielding plate, the transmittance of the shielding plate can be changed and the amount of light received by the light receiving element can be increased or decreased.

In order to solve the above problem, a trigger switch according to one aspect of the present invention is a trigger switch including the control switch mechanism described above, and includes an output controller that increases or decreases an output of the operation device along with a change in increase or decrease of the amount of light received by the light receiving element, as well as a change in increase or decrease of the amount of light received in conjunction with a retracting operation on the trigger lever.

According to one aspect of the invention, the trigger switch includes the control switch mechanism according to one aspect of the present invention. Therefore, when the retracting operation is performed on the trigger lever, the amount of received light increases or decreases due to the mechanical structure in conjunction with the retracting operation on the trigger lever. The output controller then increases or decreases the output of the operation device by the change in increase or decrease of the amount of light received by the light receiving element.

As a result, it is possible to provide a trigger switch that includes a control switch mechanism having vibration resistance and durability.

In order to solve the above problem, an electric tool according to one aspect of the present invention includes the trigger switch.

According to one aspect of the present invention, it is possible to provide an electric tool such as an electric saw or an electric drill provided with a trigger switch that includes a control switch mechanism having vibration resistance and durability.

The present invention is not restricted to each of the embodiments described above, but can be subjected to a variety of changes in the scope shown in the claims. An embodiment obtained by appropriately combining technical units disclosed respectively in different embodiments is also included in a technical scope of the present invention.

DESCRIPTION OF SYMBOLS 1-2 trigger switch
10 housing
11a first cover
11b second cover
11c third cover
13 printed board
14 plunger
15 return spring
16 trigger lever
17 bellows-like cylindrical body
20-30 control switch mechanism
21-31 optical sensor
21a-31a light emitting element
21b-31b light receiving element
22 reflector (mechanical structure)
22a inclined surface
32 shielding plate (mechanical structure)
33 slit

The invention claimed is:

1. A control switch mechanism comprising:
an optical sensor that includes a light emitting element and a light receiving element; and
a mechanical structure configured to increase or decrease an amount of light received by the light receiving element,
wherein
an increase and a decrease in output of an operation device are controlled along with an increase and decrease in amount of light received by the light receiving element due to relative movement between the optical sensor and the mechanical structure,
the optical sensor is a transmission type optical sensor, and
the mechanical structure is made of a shielding plate which is provided between the light emitting element and the light receiving element, and increases or decreases the amount of light received by the light receiving element by relative movement between the optical sensor and the mechanical structure.

2. The control switch mechanism according to claim 1, wherein a slit through which light emitted from the light emitting element passes is formed in the shielding plate, and an opening area of the slit in the shielding plate varies in accordance with a region of the shielding plate, corresponding to relative moving amount between the optical sensor and the mechanical structure.

3. The control switch mechanism according to claim 1, wherein a transmittance of the shielding plate varies in accordance with a region of the shielding plate by changing a material, surface treatment or color of the shielding plate.

4. A trigger switch comprising a control switch mechanism including:

an optical sensor that includes a light emitting element and a light receiving element; and a mechanical structure configured to increase or decrease an amount of light received by the light receiving element, wherein an increase and a decrease in output of an operation device are controlled along with an increase and decrease in amount of light received by the light receiving element due to relative movement between the optical sensor and the mechanical structure, the trigger switch comprising an output controller configured to increase or decrease an output of the operation device along with a change in increase or decrease of the amount of light received by the light receiving element, as well as a change in increase or decrease of the amount of light received in conjunction with a retracting operation of a trigger lever.

5. An electric tool comprising the trigger switch according to claim 4.

* * * * *